(12) United States Patent
Dewa

(10) Patent No.: US 11,218,143 B2
(45) Date of Patent: Jan. 4, 2022

(54) DRIVE CIRCUIT FOR SWITCH

(71) Applicant: DENSO CORPORATION, Kariya (JP)

(72) Inventor: Tetsuya Dewa, Kariya (JP)

(73) Assignee: DENSO CORPORATION, Kariya (JP)

( * ) Notice: Subject to any disclaimer, the term of this patent is extended or adjusted under 35 U.S.C. 154(b) by 122 days.

(21) Appl. No.: 16/658,572

(22) Filed: Oct. 21, 2019

(65) Prior Publication Data

US 2020/0136603 A1    Apr. 30, 2020

(30) Foreign Application Priority Data

Oct. 25, 2018 (JP) .............................. JP2018-201191

(51) Int. Cl.
| | | |
|---|---|---|
| *H03K 3/00* | (2006.01) | |
| *H03K 17/00* | (2006.01) | |
| *H03K 17/16* | (2006.01) | |
| *H03K 17/567* | (2006.01) | |
| *H03K 17/081* | (2006.01) | |
| *H02M 1/08* | (2006.01) | |
| *H02M 7/5387* | (2007.01) | |
| *H02P 27/06* | (2006.01) | |
| *H03K 17/082* | (2006.01) | |
| *H03K 17/06* | (2006.01) | |

(52) U.S. Cl.
CPC ........ *H03K 17/08116* (2013.01); *H02M 1/08* (2013.01); *H02M 7/5387* (2013.01); *H02P 27/06* (2013.01); *H03K 17/063* (2013.01); *H03K 17/0828* (2013.01); *H03K 17/162* (2013.01); *H03K 2017/066* (2013.01); *H03K 2217/0027* (2013.01)

(58) Field of Classification Search
None
See application file for complete search history.

(56) References Cited

U.S. PATENT DOCUMENTS

| | | | | |
|---|---|---|---|---|
| 7,084,590 | B2 * | 8/2006 | Miyamoto | ............. B60L 50/61 |
| | | | | 318/400.3 |
| 7,746,158 | B2 * | 6/2010 | Morishita | ............ H03K 17/168 |
| | | | | 327/434 |
| 8,680,896 | B2 * | 3/2014 | Fukuta | .................... H02M 1/32 |
| | | | | 327/109 |
| 8,884,660 | B2 * | 11/2014 | Fukuta | ................... H03K 17/00 |
| | | | | 327/109 |
| 9,112,344 | B2 * | 8/2015 | Fukuta | ..................... H02H 7/16 |
| 9,685,945 | B2 * | 6/2017 | Osanai | ................ H03K 17/127 |
| 10,491,095 | B2 * | 11/2019 | Chen | ....................... B60L 50/16 |
| 10,979,039 | B2 * | 4/2021 | Yamamoto | .......... H03K 17/002 |

FOREIGN PATENT DOCUMENTS

| | | |
|---|---|---|
| JP | 2000-295838 A | 10/2000 |
| JP | 2010-279193 A | 12/2010 |

* cited by examiner

*Primary Examiner* — Kenneth B Wells
(74) *Attorney, Agent, or Firm* — Oliff PLC

(57) ABSTRACT

A drive circuit Dr for a switch that reduces a surge voltage caused when a switch SW is switched to an off state. The drive circuit Dr detects, as an on voltage Von, a collector-emitter voltage of the switch SW while the switch SW is in an on state. When the detected on voltage Von is large, the drive circuit Dr sets a resistance value Rd of a discharging resistor 53 when the switch SW is switched to an off state to be larger than the resistance value Rd when the detected on voltage Von is small. More specifically, the drive circuit Dr sets the resistance value Rd to a larger value as the detected on voltage Von is increased.

14 Claims, 9 Drawing Sheets

US 11,218,143 B2

DRIVE CIRCUIT FOR SWITCH

CROSS-REFERENCE TO RELATED APPLICATION

This application is based on and claims the benefit of priority from earlier Japanese Patent Application No. 2018-201191 filed Oct. 25, 2018, the description of which is incorporated herein by reference.

BACKGROUND

1. Technical Field

The present disclosure relates to a drive circuit for a switch.

2. Related Art

There is a drive circuit that reduces a surge voltage.

SUMMARY

The present disclosure provides a drive circuit for a switch. One mode of the present disclosure provides a drive circuit for a switch. The drive circuit drives a switch. The drive circuit includes an acquisition section and a setting section. The acquisition section acquires a surge-correlated value. The surge-correlated value is one of an inter-terminal voltage of the switch while the switch is in an on state and a time period from when an on command for the switch is issued to when a gate voltage of the switch reaches a determination voltage that is less than an upper limit value and is larger than or equal to a Miller voltage. When the acquired surge-correlated value is large, the setting section sets a switching speed of the switch when the switch is switched to an off state to be lower than the switching speed of the switch when the acquired surge-correlated value is small.

DETAILED DESCRIPTION OF THE PREFERRED EMBODIMENTS

Figure 1:
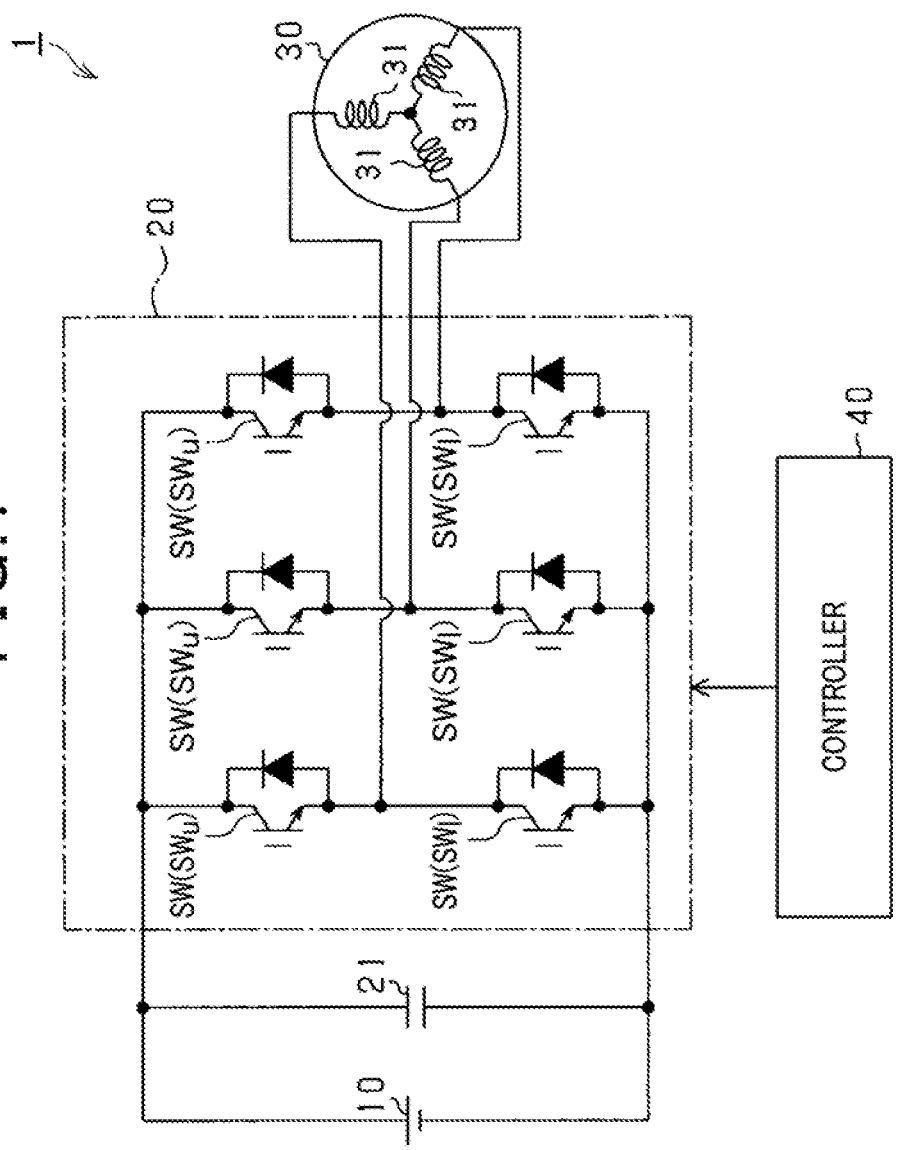
FIG. 1 is a general arrangement of a control system of a rotating electrical machine according to a first embodiment.

The inventor of the present disclosure has studied the following technique related to a drive circuit for a switch.

Japanese Unexamined Patent Application Publication No. 2000-295838 discloses a drive circuit that reduces a surge voltage by adjusting the switching speed of a switch when the switch is switched to an off state.

The present inventor has found a new method for adjusting the switching speed in order to reduce a surge voltage.

It is a primary object of the present disclosure to provide a drive circuit for a switch that reduces a surge voltage that is caused when the switch is switched to an off state.

One mode of the present disclosure provides a drive circuit for a switch. The drive circuit drives a switch. The drive circuit includes an acquisition section and a setting section. The acquisition section acquires a surge-correlated value. The surge-correlated value is one of an inter-terminal voltage of the switch while the switch is in an on state and a time period from when an on command for the switch is issued to when a gate voltage of the switch reaches a determination voltage that is less than an upper limit value and is larger than or equal to a Miller voltage. When the acquired surge-correlated value is large, the setting section sets a switching speed of the switch when the switch is switched to an off state to be lower than the switching speed of the switch when the acquired surge-correlated value is small.

The larger the current that flows through the switch while the switch is in an on state, the larger becomes the surge voltage that is caused when the switch is switched to an off state. For this reason, the larger the current that flows through the switch while the switch is in the on state, the lower the switching speed needs to be when the switch is switched to the off state.

The present inventor focused on the fact that the larger the current that flows through the switch while the switch is in the on state, the larger becomes the inter-terminal voltage of the switch when the switch is in the on state. That is, the present inventor focused on a correlation relationship between the inter-terminal voltage of the switch when the switch is in the on state and a surge voltage that is caused when the switch is switched to an off state.

Additionally, the present inventor focused on the fact that when the voltage that is less than the upper limit value of the gate voltage of the switch and is larger than or equal to the Miller voltage of the switch is referred to as the determination voltage, the larger the current that flows through the switch while the switch is in the on state, the larger becomes the time period from when an on command for the switch is issued to when the gate voltage reaches the determination voltage. That is, the present inventor focused on a correlation relationship between the time period from when an on command for the switch is issued to when the gate voltage reaches the determination voltage and a surge voltage that is caused when the switch is switched to an off state.

The present disclosure acquires the surge-correlated value, which is either the inter-terminal voltage of the switch while the switch is in the on state or the time period from when the on command is issued to when the gate voltage reaches the determination voltage. When the acquired surge-correlated value is large, the switching speed of the switch when the switch is switched to the off state is set to be lower than that when the acquired surge-correlated value is small. This reduces the surge voltage that is caused when the switch is switched to the off state.

The above and other objectives, features and advantages of the present disclosure will be made more clear by the following detailed description, given referring to the appended drawings.

Hereinafter, embodiments of the present disclosure will be described with reference to the drawings.

First Embodiment

A drive circuit according to a first embodiment of the present disclosure will be described with reference to the drawings.

As shown in FIG. 1, a control system 1 includes a DC power supply, which is a battery 10 in this embodiment, an inverter 20, and a rotating electrical machine 30. The rotating electrical machine 30 is, for example, a vehicle-mounted main engine and is capable of transmitting motive power to non-illustrated drive wheels. The rotating electrical machine 30 is electrically connected to the battery 10 through the inverter 20. In the present embodiment, the rotating electrical machine 30 is a three-phase permanent magnet synchronous machine. A capacitor 21 is connected in parallel to the battery 10.

The inverter 20 includes series connections of upper and lower arm switches SW ($SW_u$ and $SW_1$) corresponding to three phases. A first end of the capacitor 21 is connected to a high-potential terminal of each upper arm switch SW ($SW_u$), and a second end of the capacitor 21 is connected to a low-potential terminal of each lower arm switch SW ($SW_1$). In each phase, a low-potential terminal of the upper arm switch SW ($SW_u$) and a high-potential terminal of the lower arm switch SW ($SW_1$) are connected to a first end of one of coils 31 of the rotating electrical machine 30. Second ends of the coils 31 of the phases are connected together at a neutral point.

In the present embodiment, a silicon insulated gate bipolar transistor (Si-IGBT), which is a silicon (Si) device, is used as each switch SW. Thus, the high-potential terminal of each switch SW is a collector, and the low-potential terminal of each switch SW is an emitter. A freewheeling diode is connected antiparallel to each switch SW.

The control system 1 includes a controller 40. The controller 40 is mainly constituted by a microcomputer and generates drive signals for the switches SW, which constitute the inverter 20, to control the control amount (for example, torque) of the rotating electrical machine 30 to a command value. The drive signals are either an on command or an off command. The controller 40 outputs each generated drive signal to a drive circuit Dr of the corresponding switch SW. In each phase, the upper arm drive signal and the lower arm drive signal are alternately set to the on command.

Figure 2:
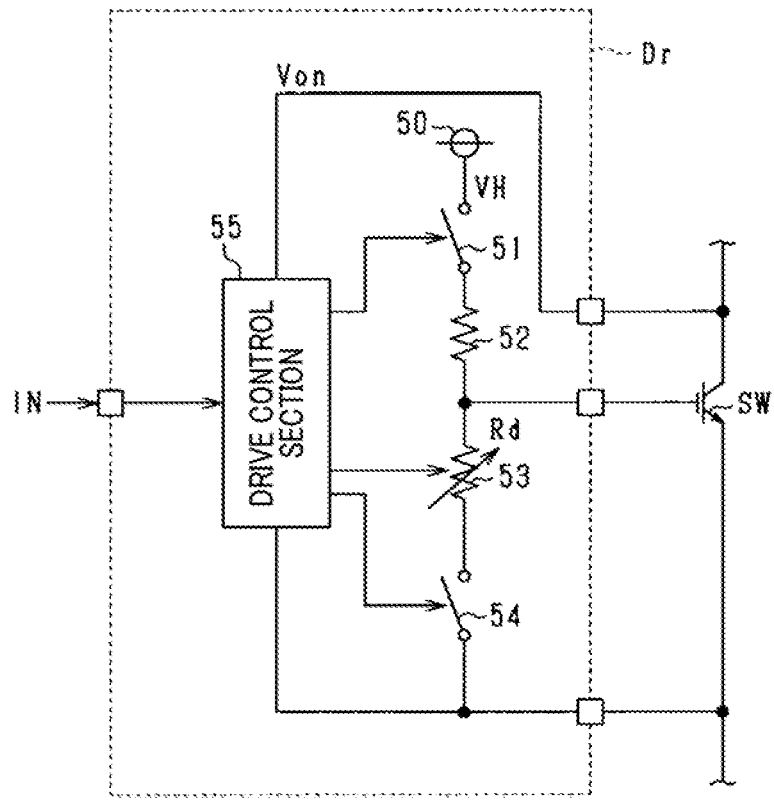
FIG. 2 is a diagram illustrating a drive circuit.

Subsequently, the structure of the drive circuit Dr will be described using FIG. 2. The drive circuits Dr corresponding to the switches SW of the present embodiment have basically the same structure.

Each drive circuit Dr is constituted by an integrated circuit and includes a constant voltage power supply 50. In the present embodiment, the output voltage of the constant voltage power supply 50 is represented by VH.

The drive circuit Dr includes a charging switch 51, a charging resistor 52, a discharging resistor 53, and a discharging switch 54. The constant voltage power supply 50 is connected to a first end of the charging switch 51, and a first end of the charging resistor 52 is connected to a second end of the charging switch 51. The gate of the switch SW is connected to a second end of the charging resistor 52.

A first end of the discharging resistor 53 is connected to the gate of the switch SW, and a first end of the discharging switch 54 is connected to a second end of the discharging resistor 53. The emitter of the switch SW is connected to a second end of the discharging switch 54.

The drive circuit Dr includes a drive control section 55. A drive signal IN generated by the controller 40 is input to the drive control section 55. If it is determined that the input drive signal IN is the on command, the drive control section 55 performs the charging process of switching on the charging switch 51 and switching off the discharging switch 54. This increases the gate voltage of the switch SW to be larger than or equal to a threshold voltage Vth and switches the switch SW to the on state. If it is determined that the input drive signal IN is the off command, the drive control section 55 performs the discharging process of switching off the charging switch 51 and switching on the discharging switch 54. This decreases the gate voltage of the switch SW to be less than the threshold voltage Vth and switches the switch SW to the off state.

The technique of the present embodiment focuses on the fact that the larger the current that flows through the switch SW while the switch SW is in the on state, the larger becomes the inter-terminal voltage of the switch SW when the switch SW is in the on state. That is, the technique of the present embodiment focuses on a correlation relationship between the inter-terminal voltage of the switch SW when the switch SW is in the on state and a surge voltage that is caused when the switch SW is switched to an off state.

Figure 3:
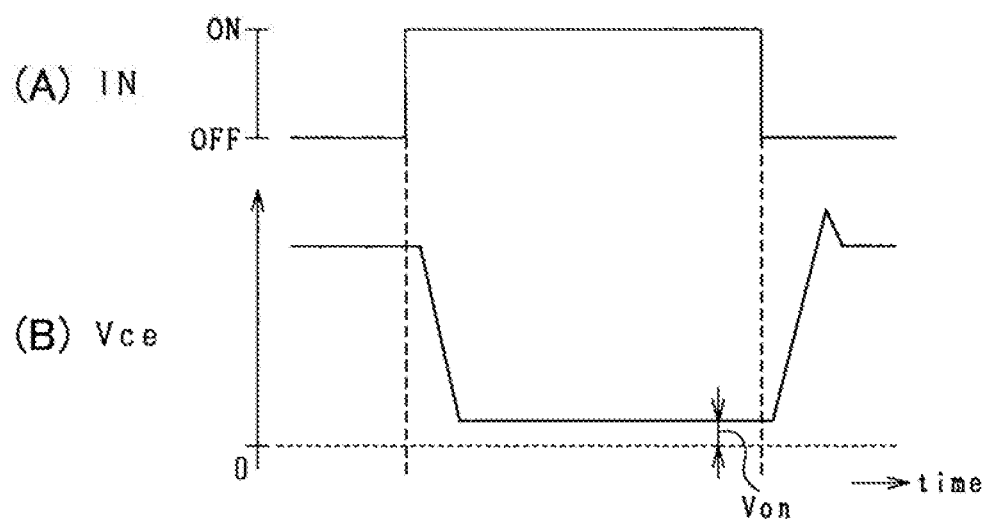
FIG. 3 is a timing chart showing the changes in a drive signal and a collector-emitter voltage.

As shown in FIG. 3, the drive control section 55 detects a collector-emitter voltage (hereinafter, referred to as the collector voltage Vce) while the switch SW is in the on state as an on voltage Von, which is a surge-correlated value. When the detected on voltage Von is large, the drive control section 55 sets a resistance value (hereinafter, referred to as an off resistance value Rd) of the discharging resistor 53 to be larger than that when the detected on voltage Von is small. FIG. 3(A) shows the changes in the drive signal IN input to the drive control section 55, and FIG. 3(B) shows the changes in the collector voltage Vce. In the present embodiment, the drive control section 55 includes an acquisition section and a setting section.

Figure 4:
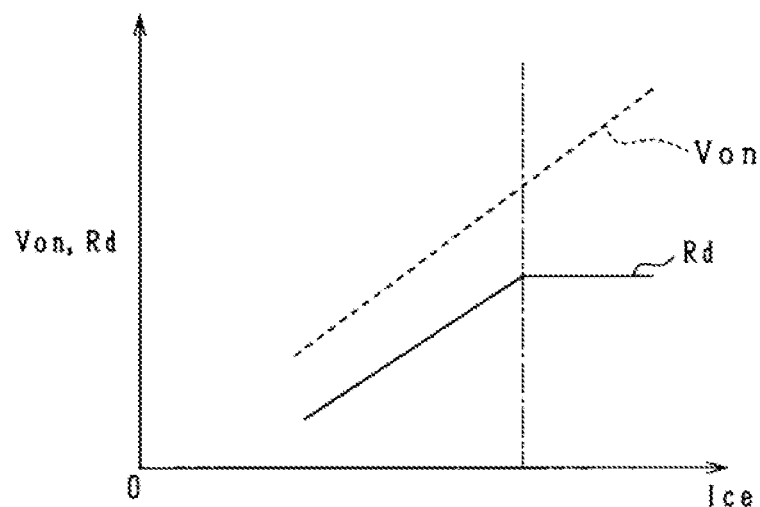
FIG. 4 is a graph showing the relationship among a collector current, an on voltage, and a resistance value of a discharging resistor.

As shown in FIG. 4, the drive control section 55 sets the off resistance value Rd to a larger value as the detected on voltage Von is increased. This is because the larger the on voltage Von, the larger becomes a collector current Ice while the switch SW is in the on state, so that the surge voltage caused when the switch SW is switched to the off state is increased. The larger the off resistance value Rd, the lower becomes the switching speed when the switch SW is switched to the off state. With this configuration, the surge voltage is appropriately reduced. In the present embodiment, if the detected on voltage Von is larger than or equal to a predetermined voltage, the drive control section 55 sets the off resistance value Rd to a constant value. Alternatively, the off resistance value Rd only needs to be set based on, for example, map information or mathematical information in which the off resistance value Rd is specified in relation to the on voltage Von. The above-mentioned information is stored in a memory (for example, a nonvolatile memory) of the drive control section 55.

Figure 5:
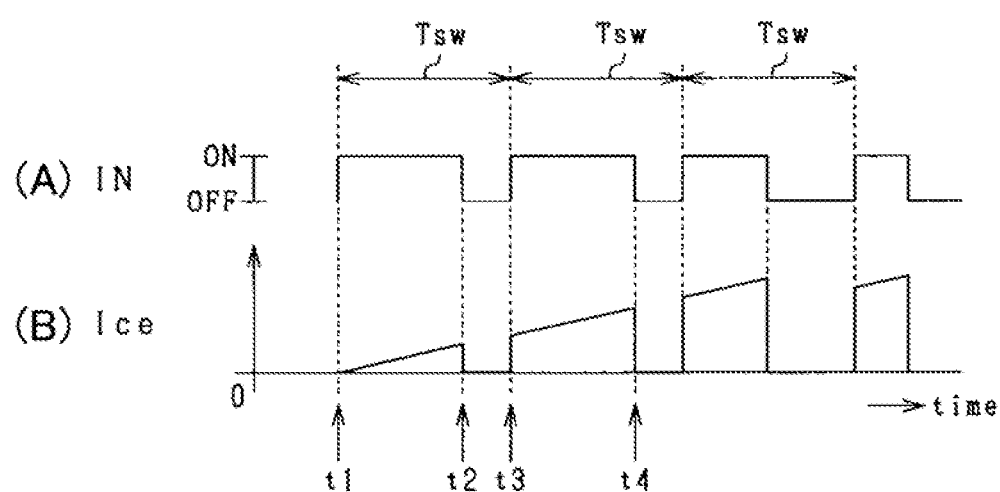
FIG. 5 is a timing chart showing the changes in the drive signal and the collector current.

The manner in which the off resistance value Rd is set in accordance with the on voltage Von will be described using FIG. 5. FIG. 5(A) shows the changes in the drive signal IN input to the drive control section 55, and FIG. 5(B) shows the changes in the collector current Ice flowing through the switch SW. In FIG. 5, Tsw indicates one switching cycle of the switch SW.

At a point in time t1, the drive signal IN is switched to the on command, so that the collector current Ice starts to increase. Subsequently, until the drive signal IN is switched to the off command at a point in time t2, the drive control section 55 detects the on voltage Von at a predetermined control cycle and sets the off resistance value Rd in accordance with the detected on voltage Von at every control cycle. That is, when the acquired surge-correlated value is larger, the drive control section 55 sets the switching speed when the switch SW is switched to the off state to be lower than the switching speed when the acquired surge-correlated value is small. If it is determined that the drive signal IN is switched to the off command at the point in time t2, the drive control section 55 starts the discharging process with the off resistance value Rd that is set immediately before. In other words, the switch SW is switched to the off state by the switching speed set at the point in time when the off command is issued. During the time period from a point in time t3 to a point in time t4 in the next switching cycle also, the same processes as the processes performed during the time period from the point in time t1 to the point in time t2 are performed.

The point in time when the collector current Ice is the largest during one switching cycle Tsw is assumed to be the point immediately before the switch SW is switched to the off state. Detecting the collector current Ice at this point in time is assumed to allow setting the off resistance value Rd that is appropriate in reducing the switching loss while reducing the surge voltage. In this respect, in the present embodiment, the drive control section 55 detects the on voltage Von at every predetermined control cycle and sets the off resistance value Rd in accordance with the detected on voltage Von at every control cycle.

Second Embodiment

Figure 6:
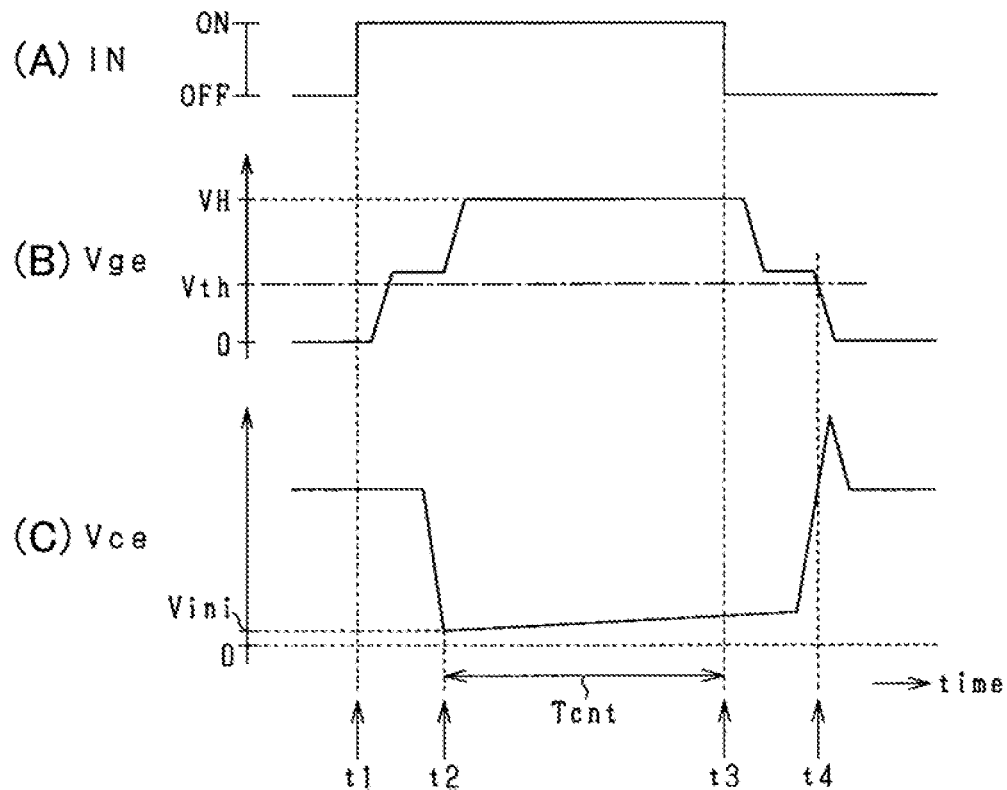
FIG. 6 is a timing chart showing the changes in a drive signal, a gate voltage, and a collector-emitter voltage according to a second embodiment.

A second embodiment will be described with reference to the drawings. The description focuses on the difference between the second embodiment and the first embodiment. In the present embodiment, a method for calculating the on voltage used for setting the off resistance value Rd is changed. The method will be described using FIG. 6. FIG. 6(A) shows the changes in the drive signal IN input to the drive control section 55, FIG. 6(B) shows the changes in the gate voltage Vge of the switch SW detected by the drive control section 55, and FIG. 6(C) shows the changes in the collector voltage Vce.

At a point in time t1, the drive signal IN is switched to the on command. This starts the charging process, causing the gate voltage Vge to start to increase. Subsequently, the collector voltage Vce starts to decrease.

Subsequently, at a point in time t2, the collector voltage Vce decreases to the minimum value in one switching cycle Tsw. The drive control section 55 detects the minimum value as a voltage initial value Vini. The drive control section 55 counts a time period Tent from the point in time t2 to a point in time t3 when the drive signal IN is switched to the off command.

From the point in time t2 to the point in time t3, the on voltage Von gradually increases as the collector current Ice gradually increases. The drive control section 55, which functions as a speed calculator, calculates the increasing speed Vel of the on voltage Von based on the detected on voltage Von during the time period after the point in time t2 until the point in time t3.

The drive control section 55, which functions as an estimation section, calculates "Vini+Vel×Tcnt" as an estimate value of the on voltage at the point in time t3 when it is determined that the drive signal IN is switched to the off command. The off resistance value Rd is set in accordance with the estimated on voltage as shown in FIG. 4.

The estimation of the on voltage and the setting of the off resistance value Rd based on the estimated on voltage only need to be executed before a point in time t4 when the gate voltage Vge is decreased to the threshold voltage Vth.

The present embodiment described above also reduces the surge voltage caused when the switch SW is switched to the off state.

Modification of Second Embodiment

The voltage initial value Vini used for estimating the on voltage does not necessarily have to be a detection value, but may be a fixed value that is supposed in designing, for example.

Third Embodiment

Figure 7:
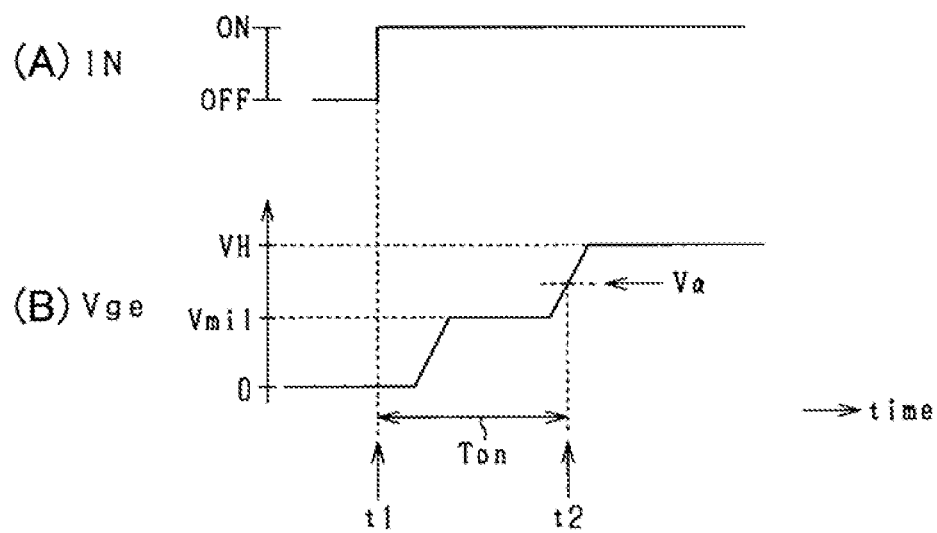
FIG. 7 is a timing chart showing the changes in a drive signal and a gate voltage according to a third embodiment.

A third embodiment will be described with reference to the drawings. The description focuses on the difference between the third embodiment and the first embodiment. In the present embodiment, a parameter used for setting the off resistance value Rd is changed. The parameter will be described using FIG. 7. FIG. 7(A) shows the changes in the drive signal IN input to the control section 55, and FIG. 7(B) shows the changes in the gate voltage Vge of the switch SW.

Vα shown in FIG. 7 indicates a determination voltage that is larger than or equal to a Miller voltage Vmil of the switch SW and less than the output voltage VH of the constant voltage power supply 50.

The technique of the present embodiment focuses on the fact that when the voltage that is less than the upper limit value Vth of the gate voltage Vge of the switch SW and is larger than or equal to the Miller voltage Vmil of the switch SW is referred to as the determination voltage Vα, the larger the current that flows through the switch SW while the switch SW is in the on state, the larger becomes the time period from when an on command for the switch is issued to when the gate voltage Vge reaches the determination voltage Vα. That is, The technique of the present embodiment focuses on a correlation relationship between the time period from when an on command for the switch SW is issued to when the gate voltage Vge reaches the determination voltage Vα and a surge voltage that is caused when the switch SW is switched to an off state.

Figure 8:
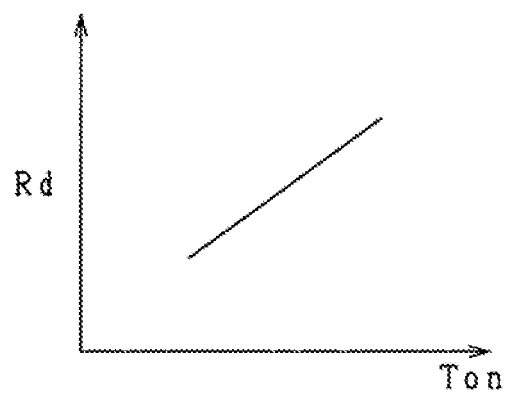
FIG. 8 is a graph showing the relationship between an on time and a resistance value of a discharging resistor.

The drive control section 55 detects the time period from a point in time t1 when the drive signal IN is switched to the on command to a point in time t2 when the gate voltage Vge reaches the determination voltage Vα as a turn-on time period Ton, which is the surge-correlated value. As shown in FIG. 8, the drive control section 55 sets the off resistance value Rd to a larger value as the detected turn-on time period Ton is increased. This is because the larger the collector current Ice that flows while the on command is issued, the longer becomes the time period from when the on command is issued to when the gate voltage Vge reaches the determination voltage Vα.

The drive control section 55 detects the turn-on time period Ton in one switching cycle Tsw and then sets the off resistance value Rd before the drive signal IN is switched to the off command. In this regard, the drive control section 55 may set the off resistance value Rd in accordance with the map information stored in the memory and the detected turn-on time period Ton. The map information is the information in which the turn-on time period Ton and the off resistance value Rd are associated with each other.

The turn-on time period Ton has a good correlation with the collector current Ice that flows immediately before the drive signal IN is switched to the off command. Thus, according to the present embodiment in which the off resistance value Rd is set in accordance with the turn-on time period Ton, the surge voltage is appropriately reduced.

Modification of Third Embodiment

In one switching cycle Tsw, the drive control section 55 sets the off resistance value Rd in accordance with the turn-on time period Ton as described in the third embodiment and subsequently sets the off resistance value Rd in accordance with the detected on voltage Von as described in the first embodiment. If it is determined that the drive signal IN is switched to the off command, the drive control section 55 uses, in the discharging process, the smaller one of the off resistance value Rd set in accordance with the turn-on time period Ton and the off resistance value Rd set in accordance with the on voltage Von. The switch SW is switched to the off state at the lower one of a first switching speed set in accordance with the acquired inter-terminal voltage and a second switching speed set in accordance with the acquired time period. With this configuration, the surge voltage is appropriately reduced.

Fourth Embodiment

Figure 9:
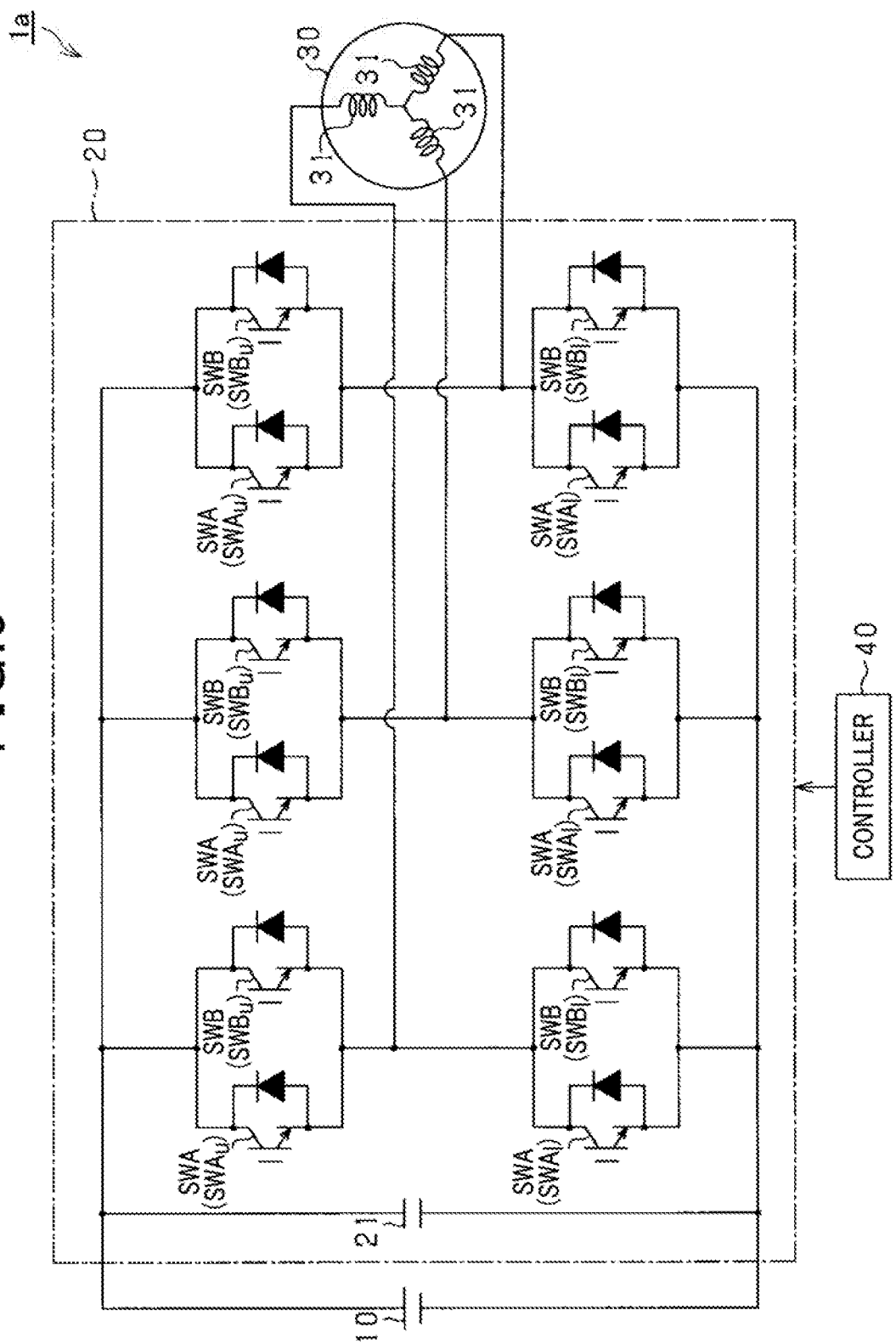
FIG. 9 is a general arrangement of a control system of a rotating electrical machine according to a fourth embodiment.

A fourth embodiment will be described with reference to the drawings. The description focuses on the difference between the fourth embodiment and the first embodiment. In a control system 1a of the present embodiment, as shown in FIG. 9, each arm of the inverter 20 includes a parallel connection of first and second switches SWA and SWB (SWA$_u$ and SWB$_u$, SWA$_1$ and SWB$_1$). In FIG. 9, those components that are the same as the components shown in FIG. 1 are given the same reference numerals for convenience.

In the present embodiment, switches having the same specification are used as the first and second switches SWA and SWB, and more specifically, IGBTs having the same threshold voltage Vth are used.

Figure 10:
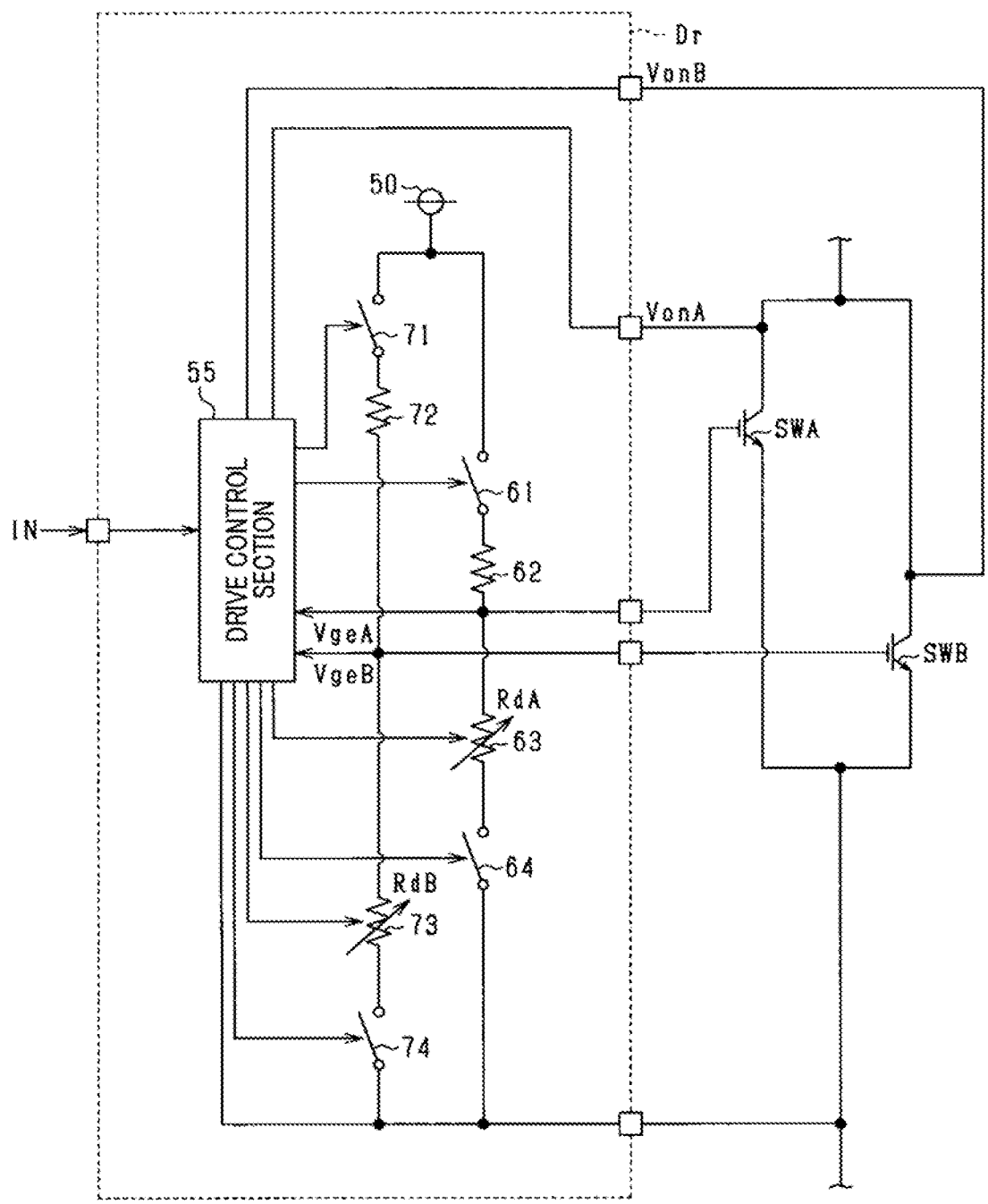
FIG. 10 is a diagram illustrating a drive circuit.

Subsequently, the structure of the drive circuit Dr according to the present embodiment will be described using FIG. 10. In FIG. 10, those components that are the same as the components shown in FIG. 2 are given the same reference numerals for convenience.

The drive circuit Dr includes a first charging switch 61, a first charging resistor 62, a first discharging resistor 63, and a first discharging switch 64. The constant voltage power supply 50 is connected to a first end of the first charging switch 61, and a first end of the first charging resistor 62 is connected to a second end of the first charging switch 61. The gate of the first switch SWA is connected to a second end of the first charging resistor 62. To the gate of the first switch SWA is connected the emitter of the first switch SWA through the first discharging resistor 63 and the first discharging switch 64.

The drive circuit Dr includes a second charging switch 71, a second charging resistor 72, a second discharging resistor 73, and a second discharging switch 74. The constant voltage power supply 50 is connected to a first end of the second charging switch 71, and a first end of the second charging resistor 72 is connected to a second end of the second charging switch 71. The gate of the second switch SWB is connected to a second end of the second charging resistor 72. To the gate of the second switch SWB is connected the emitter of the second switch SWB through the second discharging resistor 73 and the second discharging switch 74.

The drive control section 55 brings the first switch SWA and the second switch SWB in synchronization with each other and switches the first switch SWA and the second switch SWB to the on state or the off state. More specifically, if it is determined that the input drive signal IN is the on command, the drive control section 55 performs the charging process of switching on the first and second charging switches 61 and 71 and switching off the first and second discharging switches 64 and 74. This increases the gate voltage of the first and second switches SWA and SWB to be larger than or equal to the threshold voltage Vth and switches the first and second switches SWA and SWB to the on state.

If it is determined that the input drive signal IN is the off command, the drive control section 55 performs the discharging process of switching off the first and second charging switches 61 and 71 and switching on the first and second discharging switches 64 and 74. This decreases the gate voltage of the first and second switches SWA and SWB to be less than the threshold voltage Vth and switches the first and second switches SWA and SWB to the off state.

The drive control section 55 detects, as a first on voltage VonA, the collector voltage of the first switch SWA while the first switch SWA is in the on state. The drive control section 55 detects, as a second on voltage VonB, the collector voltage of the second switch SWB while the second switch SWB is in the on state. The drive control section 55 selects the larger one of the detected first and second on voltages VonA and VonB. The drive control section 55 uses the largest one of the acquired surge-correlated values for setting the switching speed. As shown in FIG. 4, the drive control section 55 sets a resistance value (hereinafter, referred to as a first off resistance value RdA) of the first discharging resistor 63 and a resistance value (hereinafter, referred to as a second off resistance value RdB) of the second discharging resistor 73 in accordance with the selected on voltage. In the present embodiment, the first off resistance value RdA and the second off resistance value RdB are set to the same value. In this regard, the drive control section 55 may set the first off resistance value RdA and the second off resistance value RdB in accordance with the map information stored in the memory and the selected on voltage. The above-mentioned map information is the information in which the on voltage (selected on voltage) is associated with the first off resistance value RdA and the second off resistance value RdB.

Even if the switches having the same specification are used as the first and second switches SWA and SWB, the on voltage may vary due to, for example, individual differences between the switches. In this case also, the present embodiment appropriately reduces the surge voltage in accordance with one of the switches that is assumed to have a larger surge voltage.

Modification of Fourth Embodiment

The drive control section 55 detects the turn-on time period TonA of the first switch SWA and the turn-on time period TonB of the second switch SWA by the method that is the same as the method described in FIG. 7. The drive control section 55 may use the longer one of the detected turn-on time periods TonA and TonB for setting the first off resistance value RdA and the second off resistance value RdB. The drive control section 55 only needs to calculate the turn-on time period TonA of the first switch SWA in accordance with the detection value of the gate voltage VgeA of the first switch SWA and the turn-on time period TonB of the second switch SWB in accordance with the detection value of the gate voltage VgeB of the second switch SWB.

In this regard, as the case described in the fourth embodiment, the drive control section 55 may set the first off resistance value RdA and the second off resistance value RdB in accordance with the longer one of the detected turn-on time periods TonA and TonB and the map information stored in the memory. The map information is the information in which the turn-on time period (the above-mentioned longer one of the time periods) is associated with the first off resistance value RdA and the second off resistance value RdB.

Fifth Embodiment

Figure 11:
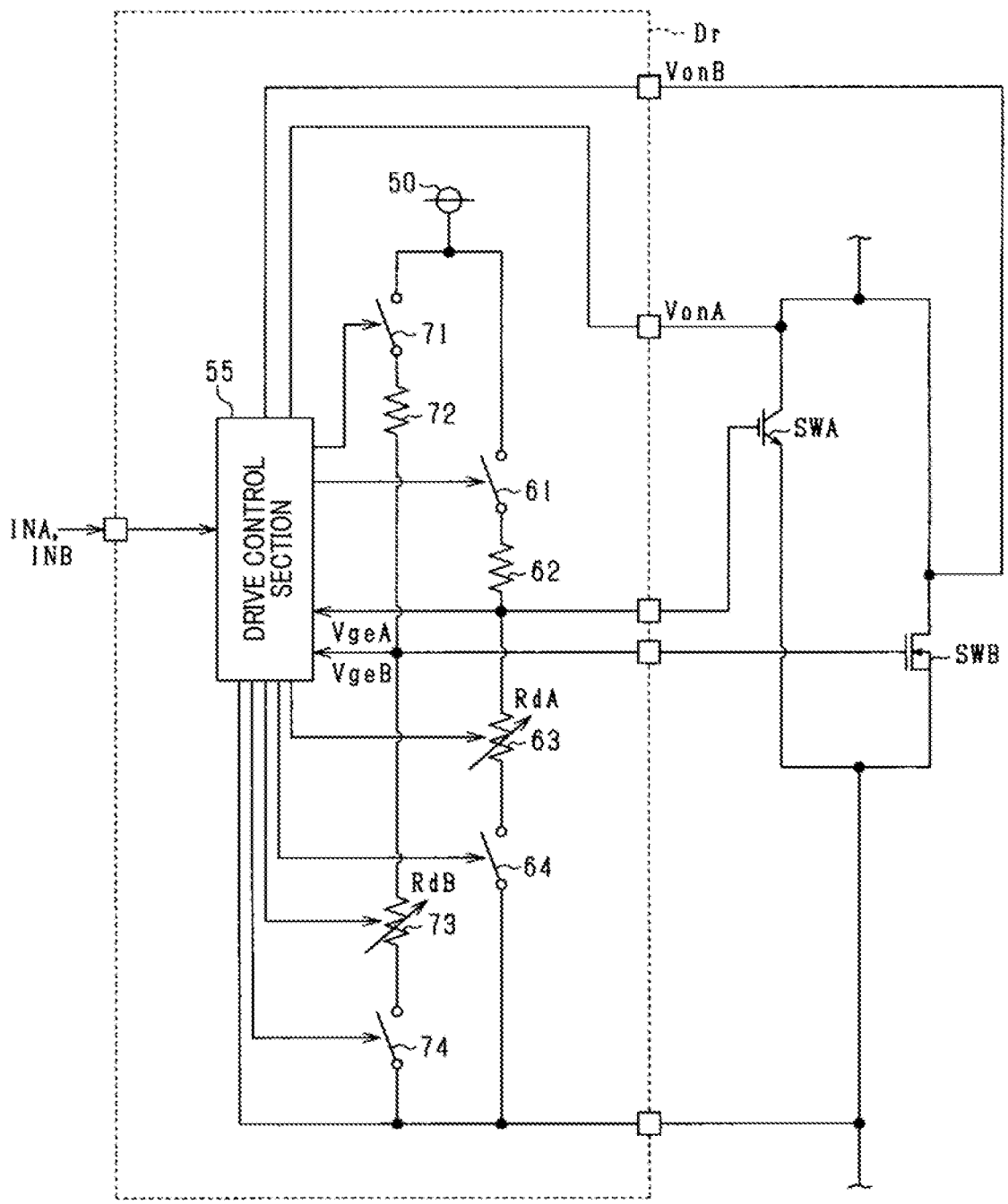
FIG. 11 is a diagram illustrating a drive circuit according to a fifth embodiment.

A fifth embodiment will be described with reference to the drawings. The description focuses on the difference between the fifth embodiment and the fourth embodiment. In the present embodiment, the second switch SWB is a SiC N-channel MOSFET as shown in FIG. 11. In FIG. 11, those components that are the same as the components shown in FIG. 10 are given the same reference numerals for convenience.

The drive control section 55 first switches the first switch SWA (corresponding to a first on switch) to the on state and subsequently switches the second switch SWB to the on state. Subsequently, the drive control section 55 first switches the second switch SWB to the off state and subsequently switches the first switch SWA (corresponding to a last off switch) to the off state. For this purpose, the drive control section 55 receives first and second drive signals INA and INB corresponding to the first and second switches SWA and SWB. The drive signals INA and INB are generated by the controller 40.

If it is determined that the input first drive signal INA is the on command, the drive control section 55 performs the charging process of switching on the first charging switch 61 and switching off the first discharging switch 64. This switches the first switch SWA to the on state. If it is determined that the input first drive signal INA is the off command, the drive control section 55 performs the discharging process of switching off the first charging switch 61 and switching on the first discharging switch 64. This switches the first switch SWA to the off state.

If it is determined that the input second drive signal INB is the on command, the drive control section 55 performs the charging process of switching on the second charging switch 71 and switching off the second discharging switch 74. This switches the second switch SWB to the on state. If it is determined that the input second drive signal INB is the off command, the drive control section 55 performs the discharging process of switching off the second charging switch 71 and switching on the second discharging switch 74. This switches the second switch SWB to the off state.

Figure 12:
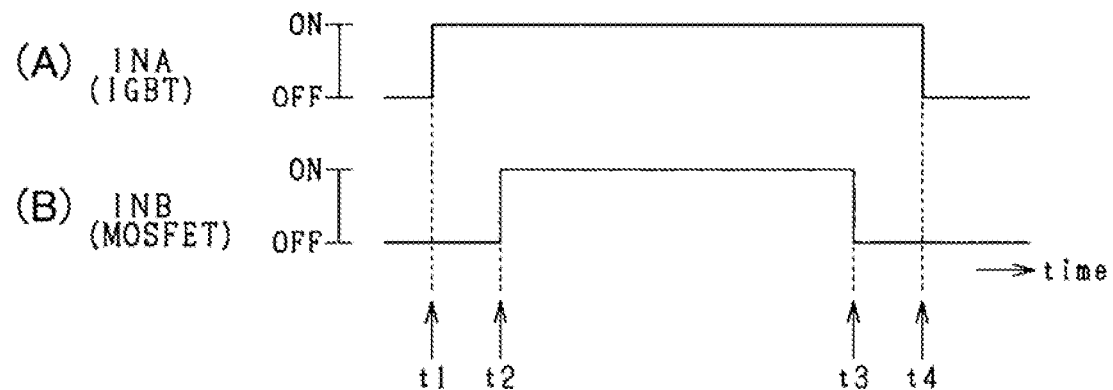
FIG. 12 is a timing chart showing the changes in first and second drive signals.

Subsequently, the setting of the first off resistance value RdA and the second off resistance value RdB will be described using FIG. 12. FIG. 12 shows the changes in the first and second drive signals INA and INB input to the drive control section 55. In FIG. 12, during the time period from a point in time t1 to a point in time t4, the first drive signal INA is the on command, and during the time period from a point in time t2 to a point in time t3, the second drive signal INB is the on command.

The drive control section 55 detects the first on voltage VonA during the time period from the point in time t1 when the first drive signal INA is switched to the on command to the point in time t4 when the first drive signal INA is switched to the off command. The drive control section 55 sets the first off resistance value RdA in accordance with the detected first on voltage VonA as shown in FIG. 4 at the point in time t4. The drive control section 55 uses the set first off resistance value RdA in the discharging process. In this regard, in the present embodiment also, the drive control section 55 may set the first off resistance value RdA based on the map information as in the fourth embodiment.

In this regard, in the present embodiment, the drive control section 55 sets the second off resistance value RdB before the point in time t3. In the present embodiment, the drive control section 55 sets the second off resistance value RdB to be less than the first off resistance value RdA. The setting is based on the fact that even if the second switch SWB is switched to the off state while the first switch SWA is in the on state, the surge voltage does not occur due to the switching.

According to the present embodiment described above, the surge voltage is appropriately reduced with the structure that drives two switches that are in parallel connection with each other.

Modification of Fifth Embodiment

In the fifth embodiment, the drive control section 55 may set the first off resistance value RdA in accordance with the turn-on time period TonA of the first switch SWA instead of the first on voltage VonA by a method that is the same as the method of the third embodiment. In this case, like the modification of the fourth embodiment, the drive control section 55 may set the first off resistance value RdA based on the map information.

Figure 13:
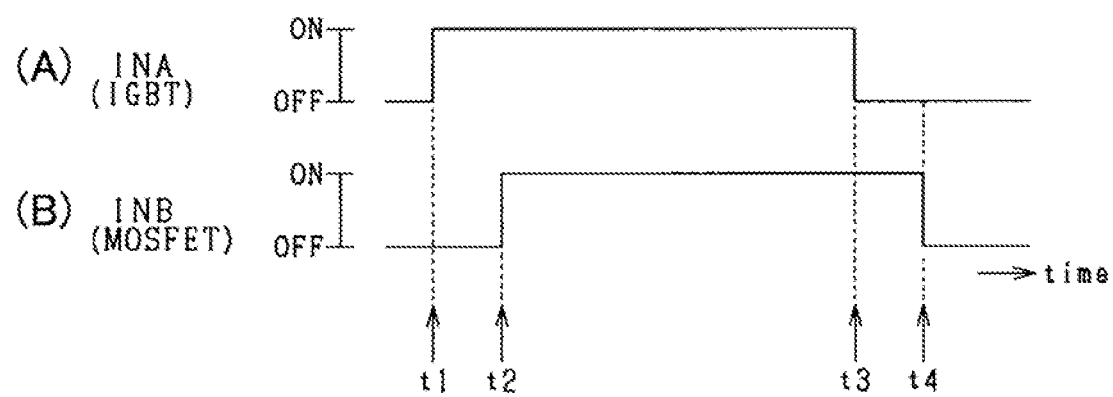
FIG. 13 is a timing chart showing the changes in first and second drive signals according to a modification of the fifth embodiment.

As shown in FIG. 13, the second switch SWB may be switched to the off state after the first switch SWA. In FIG. 13, during the time period from a point in time t1 to a point in time t3, the first drive signal INA is the on command, and during the time period from a point in time t2 to a point in time t4, the second drive signal INB is the on command. In this case, the drive control section 55 only needs to set the second off resistance value RdB in accordance with the detected first on voltage VonA. In this case, the first off resistance value RdA only needs to be set to a value smaller than the second off resistance value RdB.

Other Embodiments

Each of the above embodiments may be modified as follows.

In the structure shown in FIG. 10, the switches driven by the drive circuit Dr do not necessarily have to be IGBTs, but may be, for example, SiC-MOSFETs.

In the fourth and fifth embodiments, the number of the switches in the parallel connection that are driven by the drive circuit Dr may be three or more.

The structure for adjusting the switching speed is not limited to the structure in which the resistance value of the discharging resistor is variable. For example, in the drive circuit Dr shown in FIG. 2, the power supply may be connected to the second end of the discharging switch 54. The power supply variably sets the output potential to the emitter potential of the switch SW or to a negative potential lower than the emitter potential. In this case, the lower the output potential of the power supply, the larger becomes the potential difference between the gate voltage of the switch SW and the output voltage of the power supply. Thus, the switching speed is increased.

The rotating electrical machine does not necessarily have to be a permanent magnet synchronous machine, but may be a wound-field synchronous machine, for example. The rotating electrical machine does not necessarily have to be a synchronous machine, but may be an induction machine, for example. Furthermore, the rotating electrical machine does not necessarily have to be a vehicle-mounted main engine, but may be those used for other purposes such as an electric motor constituting an electric power steering device or an electric compressor for an air conditioning system. Furthermore, the rotating electrical machine may be other than a three-phase rotating electrical machine.

The power converter including switches is not limited to be an inverter.

What is claimed is:

1. A drive circuit for driving a switch, the drive circuit comprising:
   an acquisition section, which acquires a surge-correlated value, the surge-correlated value being a time period from when an on command for the switch is issued to when a gate voltage of the switch reaches a determination voltage that is less than an upper limit value and is larger than or equal to a Miller voltage; and
   a setting section, wherein, when the acquired surge-correlated value is a first value, the setting section sets a switching speed of the switch when the switch is switched to an off state to be lower than the switching speed of the switch when the acquired surge-correlated value is a second value, the first value is larger than the second value.

2. The drive circuit according to claim 1, wherein the setting section sets the switching speed when the switch is switched to the off state to a lower value as the acquired surge-correlated value is increased.

3. The drive circuit according to claim 1, wherein
   the drive circuit drives a plurality of the switches that are in parallel connection with each other,
   the acquisition section acquires the surge-correlated value of each switch of the plurality of switches while each switch is in the on state, and
   the setting section uses the largest one of the acquired surge-correlated values for setting the switching speed.

4. A drive circuit for driving a switch, the drive circuit comprising:
   an acquisition section, which acquires a surge-correlated value, the surge-correlated value being an inter-terminal voltage of the switch while the switch is in an on state; and
   a setting section, wherein, when the acquired surge-correlated value is a first value, the setting section sets a switching speed of the switch when the switch is switched to an off state to be lower than the switching speed of the switch when the acquired surge-correlated value is a second value, the first value is larger than the second value, wherein,
   after the on command is issued, the acquisition section acquires the inter-terminal voltage at every predetermined control cycle during a time period until an off command for the switch is issued,
   the setting section sets the switching speed in accordance with the inter-terminal voltage every time the acquisition section acquires the inter-terminal voltage, and
   the switch is switched to the off state by the switching speed set at the point in time when the off command is issued.

5. The drive circuit according to claim 1, wherein
   the drive circuit drives a plurality of the switches that are in parallel connection with each other,
   among the plurality of switches that are in the off state, the switch that is switched to the on state first is referred to as a first on switch and among the plurality of switches that are in the on state, the switch that is switched to the off state last is referred to as a last off switch,
   the acquisition section acquires the surge-correlated value of the first on switch, and
   when the surge-correlated value is the first value, the setting section sets the switching speed of the last off switch when the last off switch is switched to the off state to be lower than the switching speed when the acquired s surge-correlated value is the second value.

6. The drive circuit according to claim 4, wherein
   the acquisition section further acquires a time period from when the on command is issued to when the gate voltage reaches the determination voltage, and
   the switch is switched to the off state at the lower one of a first switching speed set in accordance with the acquired inter-terminal voltage and a second switching speed set in accordance with the acquired time period.

7. The drive circuit according to claim 4, wherein the setting section sets the switching speed when the switch is switched to the off state to a lower value as the acquired surge-correlated value is increased.

8. The drive circuit according to claim 4, wherein
   the drive circuit drives a plurality of the switches that are in parallel connection with each other,
   the acquisition section acquires the surge-correlated value of each switch of the plurality of switches while each switch is in the on state, and
   the setting section uses the largest one of the acquired surge-correlated values for setting the switching speed.

9. The drive circuit according to claim 4, wherein
   the drive circuit drives a plurality of the switches that are in parallel connection with each other,
   among the plurality of switches that are in the off state, the switch that is switched to the on state first is referred to as a first on switch, and among the plurality of switches that are in the on state, the switch that is switched to the off state last is referred to as a last off switch,
   the acquisition section acquires the surge-correlated value of the first on switch, and
   when the surge-correlated value is the first value, the setting section sets the switching speed of the last off switch when the last off switch is switched to the off state to be lower than the switching speed when the acquired s surge-correlated value is the second value.

10. A drive circuit for driving a switch, the drive circuit comprising:
    an acquisition section, which acquires a surge-correlated value, the surge-correlated value being an inter-terminal voltage of the switch while the switch is in an on state;
    a setting section, wherein, when the acquired surge-correlated value is a first value, the setting section sets a switching speed of the switch when the switch is switched to an off state to be lower than the switching speed of the switch when the acquired surge-correlated value is a second value, the first value is larger than the second value;

a speed calculator, which calculates an increase speed of the inter-terminal voltage in accordance with the inter-terminal voltage acquired by the acquisition section during the time period after the on command is issued until the off command for the switch is issued; and an estimation section, which estimates the inter-terminal voltage at the point in time when the off command is issued in accordance with the calculated increase speed, wherein the acquisition section acquires the estimated inter-terminal voltage as the surge-correlated value.

11. The drive circuit according to claim 10, wherein the setting section sets the switching speed when the switch is switched to the off state to a lower value as the acquired surge-correlated value is increased.

12. The drive circuit according to claim 10, wherein
the drive circuit drives a plurality of the switches that are in parallel connection with each other,
the acquisition section acquires the surge-correlated value of each switch of the plurality of switches while each switch is in the on state, and
the setting section uses the largest one of the acquired surge-correlated values for setting the switching speed.

13. The drive circuit according to claim 10, wherein
the drive circuit drives a plurality of the switches that are in parallel connection with each other,
among the plurality of switches that are in the off state, the switch that is switched to the on state first is referred to as a first on switch, and among the plurality of switches that are in the on state, the switch that is switched to the off state last is referred to as a last off switch,
the acquisition section acquires the surge-correlated value of the first on switch, and
when the surge-correlated value is the first value, the setting section sets the switching speed of the last off switch when the last off switch is switched to the off state to be lower than the switching speed when the acquired s surge-correlated value is the second value.

14. The drive circuit according to claim 10, wherein
the acquisition section further acquires a time period from when the on command is issued to when the gate voltage reaches the determination voltage, and
the switch is switched to the off state at the lower one of a first switching speed set in accordance with the acquired inter-terminal voltage and a second switching speed set in accordance with the acquired time period.

* * * * *